United States Patent
Strabley et al.

(10) Patent No.: US 9,077,354 B2
(45) Date of Patent: Jul. 7, 2015

(54) LOW POWER REDUCTION OF BIASES IN A MICRO PRIMARY FREQUENCY STANDARD

(71) Applicant: Honeywell International Inc., Morristown, NJ (US)

(72) Inventors: Jennifer S. Strabley, Maple Grove, MN (US); Kenneth Salit, Plymouth, MN (US); Karl D. Nelson, Plymouth, MN (US); Ben Luey, Denver, CO (US); Mike Anderson, Denver, CO (US)

(73) Assignee: Honeywell International Inc., Morristown, NJ (US)

( * ) Notice: Subject to any disclaimer, the term of this patent is extended or adjusted under 35 U.S.C. 154(b) by 254 days.

(21) Appl. No.: 13/759,444

(22) Filed: Feb. 5, 2013

(65) Prior Publication Data

US 2013/0265112 A1 Oct. 10, 2013

Related U.S. Application Data

(60) Provisional application No. 61/622,261, filed on Apr. 10, 2012.

(51) Int. Cl.
*H03L 7/26* (2006.01)
*G04F 5/14* (2006.01)

(52) U.S. Cl.
CPC ... *H03L 7/26* (2013.01); *G04F 5/14* (2013.01)

(58) Field of Classification Search
CPC .................................. H03B 17/00; H03L 7/26
USPC ....................................... 331/3, 94.1; 250/281
See application file for complete search history.

(56) References Cited

U.S. PATENT DOCUMENTS

| | | | |
|---|---|---|---|
| 5,338,930 | A | 8/1994 | Chu et al. |
| 5,420,549 | A | 5/1995 | Prestage |
| 5,528,028 | A | 6/1996 | Chu et al. |
| 5,606,291 | A | 2/1997 | Verbanets |
| 5,657,340 | A | 8/1997 | Camparo et al. |
| 5,852,386 | A | 12/1998 | Chantry et al. |
| 6,762,869 | B2 | 7/2004 | Maleki et al. |
| 6,919,770 | B2 | 7/2005 | Happer et al. |
| 7,102,451 | B2 | 9/2006 | Happer et al. |
| 7,323,941 | B1 | 1/2008 | Happer et al. |
| 7,778,293 | B2 | 8/2010 | Vanier |
| 7,852,163 | B2 | 12/2010 | Braun et al. |
| 7,859,350 | B1 | 12/2010 | Schwindt et al. |
| 7,944,317 | B2 | 5/2011 | Strabley et al. |
| 7,956,697 | B2 * | 6/2011 | Aoyama et al. .............. 331/94.1 |

(Continued)

OTHER PUBLICATIONS

U.S. Patent and Trademark Office, Office Action, from U.S. Appl. No. 13/759,400, Jun. 16, 2014, pp. 1-20, Published in: US.

(Continued)

*Primary Examiner* — Joseph Chang
*Assistant Examiner* — Jeffrey Shin
(74) *Attorney, Agent, or Firm* — Fogg & Powers LLC

(57) ABSTRACT

A method for reducing or eliminating clock bias in an atomic clock is provided. The method comprises cooling a population of atoms collected in the atomic clock using a laser locked at a predetermined frequency, turning off the laser, performing atomic clock spectroscopy, turning on the laser after the atomic clock spectroscopy, and relocking the frequency of the laser to an external reference cell. The population of atoms that are in each of two ground hyperfine levels is then probed using laser light that is on or near-resonant with a selected atomic transition.

20 Claims, 5 Drawing Sheets

(56) References Cited

U.S. PATENT DOCUMENTS

| | | |
|---|---|---|
| 7,965,147 B2 | 6/2011 | Strabley et al. |
| 8,009,520 B2 | 8/2011 | Jau et al. |
| 2003/0052264 A1* | 3/2003 | Baba et al. .................... 250/281 |
| 2008/0130694 A1* | 6/2008 | Nakagawa ...................... 372/32 |
| 2009/0058545 A1 | 3/2009 | Prestage et al. |
| 2010/0033256 A1* | 2/2010 | Strabley et al. ............. 331/94.1 |
| 2011/0073753 A1* | 3/2011 | Bouyer et al. ................ 250/251 |
| 2013/0003059 A1 | 1/2013 | Salit et al. |
| 2013/0270434 A1 | 10/2013 | Nelson et al. |

OTHER PUBLICATIONS

U.S. Patent and Trademark Office, "Notice of Allowance and Fee(s) Due", U.S. Appl. No. 13/759,400, Sep. 30, 2014, pp. 1-9.

* cited by examiner

LOW POWER REDUCTION OF BIASES IN A MICRO PRIMARY FREQUENCY STANDARD

This application claims the benefit of priority to U.S. Provisional Application No. 61/622,261, filed on Apr. 10, 2012, which is incorporated by reference.

STATEMENT REGARDING FEDERALLY SPONSORED RESEARCH OR DEVELOPMENT

This invention was made with Government support under Government Contract No. W31P4Q-09-C-0348 awarded by DARPA. The Government has certain rights in the invention.

BACKGROUND

Primary frequency standards are atomic clocks that need to operate without recalibration for long periods of time, such as several months. Recent emphasis on reducing the size, weight, and power of these devices has motivated development of miniature primary frequency standards which are based on the microwave hyperfine transition in alkali atoms, typically either Cesium or Rubidium. To achieve the required stability, one conventional approach uses laser cooled atoms that enable narrow clock linewidths in a small size. Atoms are pre-cooled for a background atomic vapor into a magneto-optical trap (MOT) or optical molasses. Atoms in the MOT serve as the source for the clock measurement. The atoms are released from the MOT and, ideally, are free from any external field (optical or magnetic). During this time, microwave spectroscopy using an external crystal oscillator is performed to measure the atomic hyperfine transition. In miniature primary standards the spectroscopy duration is typically tens of milliseconds. After the microwave spectroscopy, an optical lightwave is used to probe the populations in the individual hyperfine states, completing the spectroscopy. Information from the spectroscopic measurement is used to discipline the long-term stability of the external crystal oscillator.

These systems use an external laser that performs both the laser cooling and the probing of the atomic states after the microwave spectroscopy. The laser frequency must be precisely stabilized to the appropriate atomic hyperfine transitions. Typically, this stabilization is performed using laser spectroscopy on a separate atomic vapor cell (reference cell). Several techniques can be used, including polarization based spectroscopy and saturated absorption spectroscopy (SAS). While polarization based spectroscopy systems typically have large capture regions, these techniques require frequency calibration and can drift with changes in temperature. The SAS is self-calibrating and immune to drifts in temperature, but has a much smaller capture region, typically limited to the hyperfine linewidth.

When the laser is used to load the MOT, the light must be detuned from the atomic resonance to account for the atoms' Doppler shift. However, when the laser is used to probe the atoms after spectroscopy, it is preferred that the laser be stabilized on resonance with the atoms. The probing step typically occurs very quickly after the spectroscopy (less than 1 ms later).

The presence of external fields during atomic clock spectroscopy can provide large clock shifts, which will appear as clock biases or drift. Through the choice of appropriate clock transitions and the use of magnetic shielding, the magnetic shifts can be managed, leaving the dominant clock shift caused by atoms interacting with the near resonance light via the AC Stark shift. The Stark shift can be reduced by two ways: reducing the amount of light on the atoms during the spectroscopy, or changing the frequency of the light so that it is far off resonance with the atoms. To achieve primary frequency standard performance, the required attenuation is often larger than 80 dB even when combined with a greater than 10 GHz laser shift.

To reach these levels of extinction, larger laboratory-scale systems can use mechanical shutters, which completely block the optical lightwaves, but these are large, relatively slow, and not mechanically robust enough for continuous, long-term operation. Larger systems can also make use of acousto-optic beam shifters which provide 80 dB of attenuation and nano-second switching speeds, but have large footprints, require Watts of optical power, and result in insertion losses as large as 3 dB.

Smaller systems striving to minimize power consumption and footprint, have tight requirements on size, speed, and insertion loss, but still have the same extinction requirements. Smaller systems have explored alternative shutter technology such as MEMs mirrors, electro-optic, or liquid crystal. While these shutters are an alternative to the mechanical shutters for the most part, these technologies fail to meet the speed and/or extinction requirement. The extinction can be increased by concatenating stages, but at the expense of increasing the insertion loss and increasing the optical footprint. Alternatively, the large laser frequency shift can be used in conjunction with these shutter technologies, but the frequency jump must be very large. Increasing the laser frequency shift during spectroscopy adds risk of re-acquiring the resonant light needed for the atomic probing, especially using SAS with the limited capture region.

SUMMARY

A method for reducing or eliminating clock bias in an atomic clock is provided. The method comprises cooling a population of atoms collected in the atomic clock using a laser locked at a predetermined frequency, turning off the laser, performing atomic clock spectroscopy, turning on the laser after the atomic clock spectroscopy, and relocking the frequency of the laser to an external reference cell. The population of atoms that are in each of two ground hyperfine levels is then probed using laser light that is on or near-resonant with a selected atomic transition.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

Figure 1:
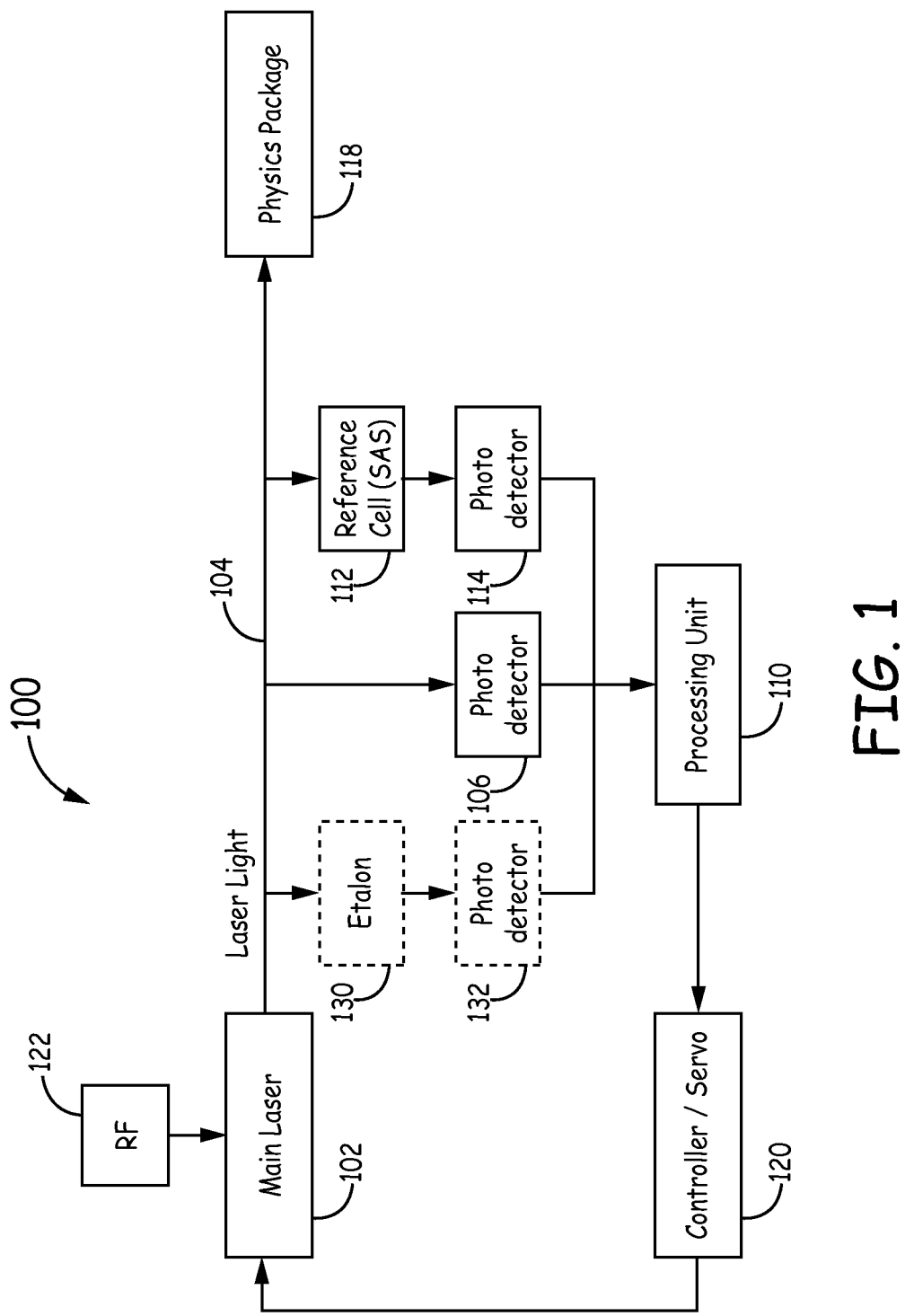
FIG. 1 is a block diagram illustrating the physical arrangement of a laser apparatus for an atomic clock used as a primary frequency standard according to one embodiment.

In the following detailed description, reference is made to the accompanying drawings that form a part hereof, and in which is shown by way of illustration specific illustrative embodiments. It is to be understood that other embodiments may be utilized and that logical, mechanical, and electrical changes may be made. Furthermore, the method presented in the figures and the specification is not to be construed as limiting the order in which the individual steps may be performed. The following detailed description is, therefore, not to be taken in a limiting sense.

The present approach includes a technique for eliminating the AC stark shift without requiring a large frequency shift, with minimal increase in the clock footprint, and without any added insertion loss. This technique directly turns off the laser current during atomic clock spectroscopy, eliminating the optical power without an external shutter. In an alternative embodiment, the present technique uses electronic algorithms in combination with a calibrated etalon to rapidly reacquire lock prior to probing the atoms.

The present approach can be used in a method for low power reduction or elimination of biases in an atomic clock such as a micro primary frequency standard. The method generally comprises cooling a population of atoms collected in a magneto-optical trapping device of the atomic clock using a laser locked at a predetermined frequency, and turning off the laser while making a spectroscopic measurement of the clock transition. The laser is turned on after the atomic clock spectroscopy, and the frequency of the laser is relocked to an external reference cell. The number of atoms that are in each of a ground hyperfine level is then probed using light that is on or near-resonant with an appropriate atomic transition.

The present technique turns off the laser during atomic radio frequency (RF) spectroscopy (Ramsey pulses), eliminating the AC Stark shift and the resulting clock bias or drift in the atomic clock. The laser can be turned off by removing the current through the diode in the laser. During the shut off period, the laser is no longer frequency stabilized and remains off for the atomic clock spectroscopy. The laser is then turned back on for atomic probing. Prior to the probing, the laser device must regain its frequency lock. The present technique overcomes the difficulties in regaining the frequency lock, making feasible turning off the laser and then on again.

In turning the laser on again, a feed-forward of the laser current can be used to compensate for temperature-induced frequency shifts that occur during the off period, allowing the laser to achieve a stable lock in under 1 ms. An error signal to the diode is derived from a compact external reference cell containing an atomic or molecular reference and optionally an etalon such as a solid etalon. The external reference cell provides absolute frequency accuracy. When used, the etalon provides a large capture range to enhance the robustness of the laser locking. All of this can be accomplished with minimal size and minimal power, while using standard components employed in miniature atomic clocks.

FIG. 1 is a block diagram illustrating the physical arrangement of a laser apparatus 100 for an atomic clock used as a primary frequency standard according to one embodiment. The laser apparatus 100 includes a main laser device 102 that is configured to emit laser light 104 at a predetermined frequency. A portion of laser light 104 is directed to a photodetector 106, which converts the light to an electrical signal that is transmitted to a processing unit 110. A portion of laser light 104 is also directed to an external reference cell 112 for saturated absorption spectroscopy (SAS), which sends an optical signal to a photodetector 114, which in turn transmits an electrical signal to processing unit 110.

The laser light 104 is also transmitted to a physics package 118 that is part of the atomic clock. An exemplary physics package is disclosed in U.S. Pat. No. 7,965,147, entitled PHYSICS PACKAGE DESIGN FOR A COLD ATOM PRIMARY FREQUENCY STANDARD, the disclosure of which is incorporated by reference herein. A processed signal from processing unit 110 is sent to an input of a controller or servo unit 120, which in turn transmits a feedback signal to an input of laser device 102 to adjust the frequency of laser light 104 as required.

In addition, an RF generating device 122 can be employed to transmit an RF signal to laser device 102 to generate optical sidebands, which serve as the repumping light required for a magneto-optical trapping (MOT) device. This allows atom trapping to be performed by a single laser device.

In an alternative embodiment, a portion of laser light 104 can be directed to an etalon 130, which sends an optical signal to a photodetector 132, which in turn transmits an electrical signal to processing unit 110.

In one embodiment, laser device 102 can be a distributed Bragg reflector (DBR) laser diode. In another embodiment, the laser device includes a vertical-cavity surface-emitting laser (VCSEL).

The processing unit 110 can include one or more processors implemented using software, firmware, hardware, or any appropriate combination thereof, as known to one of skill in the art. The one or more processors may be supplemented by, or incorporated in, specially-designed application-specific integrated circuits (ASICs) or field-programmable gate arrays (FPGAs). The processor can also include or function with software programs, firmware, or other computer readable instructions for carrying out various process tasks, calculations, and control functions used in the present method. These instructions are typically stored on any appropriate computer readable medium used for storage of computer readable instructions or data structures. The computer readable medium can be implemented as any available media that can be accessed by a general purpose or special purpose computer or processor, or any programmable logic device.

Suitable computer or processor readable media may include storage or memory media such as magnetic or optical media. For example, storage or memory media may include conventional hard disks, Compact Disk—Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), flash memory, or the like.

Figure 2:
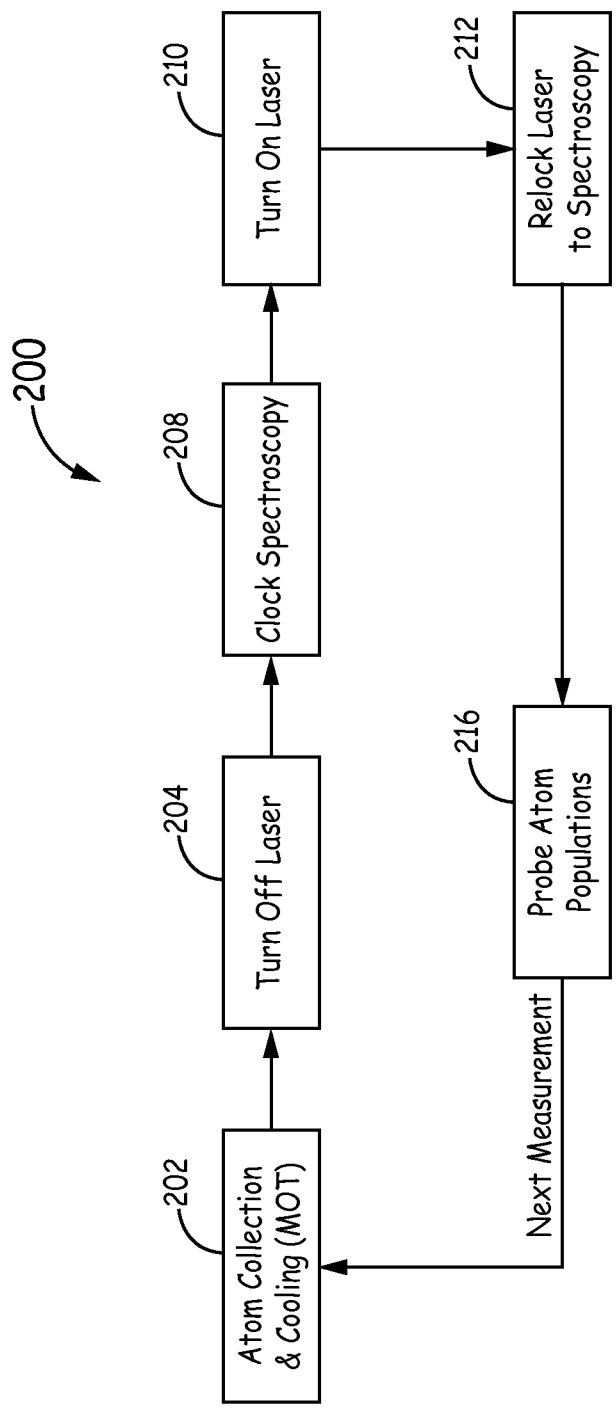
FIG. 2 is a flow diagram of a process for reducing or eliminating clock bias from atoms in an atomic clock interacting with laser light from the laser apparatus of FIG. 1.

FIG. 2 is flow diagram of a process 200 for reducing or eliminating clock bias from atoms interacting with light by turning off the laser device during atomic clock spectroscopy. Initially, atom collection and cooling takes place in a magneto-optical trapping (MOT) device at 202. The MOT device is located in the physics package of an atomic clock such as physics package 118 shown in FIG. 1.

As shown in FIG. 2, the laser device is turned off at 204, and the atomic clock spectroscopy is performed at 208. During this time the atoms' hyperfine transition (the microwave clock transition) is measured by performing RF spectroscopy followed by optical probing. During the clock spectroscopy, the atoms' energy levels are unperturbed by any external forces (optical or magnetic). By turning off the laser during this step, energy level shifts from the optical lightwaves are eliminated.

In one embodiment, to turn off the laser device the current can be shunted to ground using a transistor in parallel with a laser diode. The voltage across the diode drops to hundreds of millivolts, so no current flows through the diode. As the leakage current is well below threshold, any light emitted by the diode will be broadband and only weakly interact with the narrow atomic transitions. By using a current shunt, the current driver always provides a fixed amount of current, increasing the speed of turn-off even with filtering capacitors and inductors in the current driver.

The laser device is then turned back on at 210 to optically probe how many atoms are in each of the two ground hyperfine levels. In one embodiment, the laser can be turned back on by turning off the transistor shunt. Prior to the optical probing, laser light is relocked to spectroscopy at 212 to make the light resonant with the appropriate optical transitions. The atom populations are then probed at 216. Fluorescence photons from each of the two hyperfine levels are collected to determine the population. The process 200 then returns to block 202 to take another measurement.

In prior approaches that use a shutter, such as a high attenuation shutter (HAS), the shutter is activated during the clock spectroscopy to strongly attenuate the optical lightwaves. The present technique illustrated in FIG. 2 has several advantages over techniques that use a shutter. These include no added insertion loss (the shutter will have some insertion loss); no added footprint; no added power consumption; and no need to jump the frequency to compensate for residual light shifts because the shutter does not have sufficient attenuation.

In the present technique, the population of atoms in the ground hyperfine states remains unchanged between the clock spectroscopy and the optical probe, during the time the laser is turning back on and re-acquiring lock. If needed, a low attenuation shutter (LAS) can be used to block the laser light while it is re-acquiring lock. As the LAS has low attenuation, it is likely to have lower insertion loss than an HAS.

Figure 3:
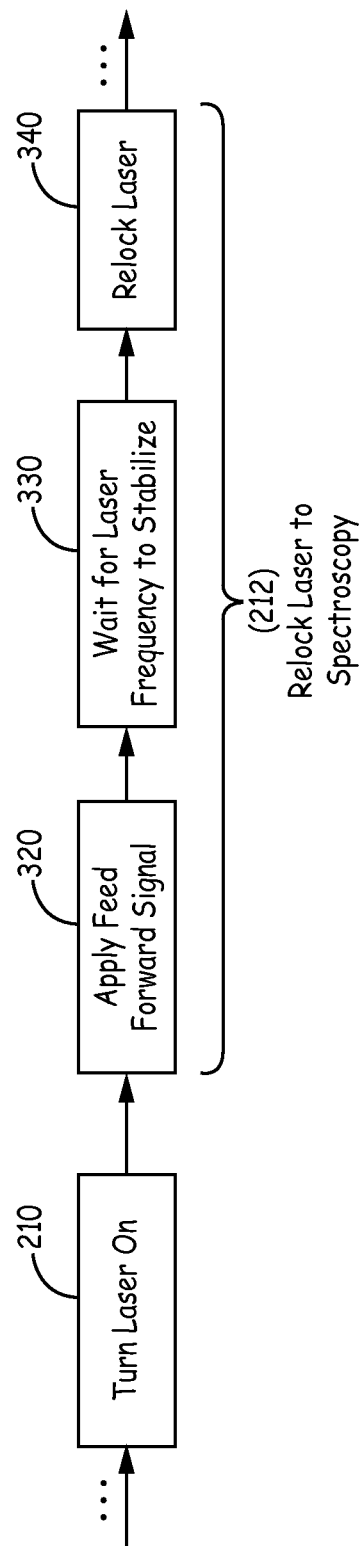
FIG. 3 is a flow diagram for a process used to relock the laser to spectroscopy in the process of FIG. 2.

FIG. 3 is a flow diagram for a process that can be used to relock the laser to spectroscopy at 212 (from FIG. 2), in which a feed-forward signal is used to decrease relock from the off time and increase relocking reliability. As shown in FIG. 3, after the laser device in turned back on at 210, a feed-forward signal is applied at 320. The process waits for the laser frequency to stabilize at 330, and then the laser is relocked at 340.

When the laser device is turned on, the laser current heats the diode, causing the laser frequency to change. This change in laser frequency is mitigated by adding the feed-forward signal to precisely compensate for the thermal change to the laser device. In one embodiment, the feed-forward signal can be fed into the laser device via a shunt resistor. A "thick" etalon with a 3 GHz free-spectral-range (FSR) can be used to measure the changing frequency of the laser device after turn-on. The feed-forward signal is adjusted to minimize the frequency change.

The feed-forward signal is a controllable arbitrary time-varying signal and can be generated by various techniques. For example, the feed-forward signal can be computer generated with a digital to analog converter (DAC) from spline functions, line-segments, polynomials, and the like. The feed-forward signal can also be an analog signal from resistor-capacitor (RC) time-constants, can be from a function generator, or can be generated by a Direct Digital Synthesizer (DDS). The frequency of the laser light can be measured with an etalon, a beat note with a reference laser, a wavemeter, a lambda meter, spectroscopy, or the like. The feed-forward signal can be adjusted to minimize frequency change of the laser such as by iteration (random changes, genetic algorithm, etc.), direct calculation, or the like.

In one embodiment, the feed-forward signal can be generated by a computer using a spline function to join a set of time and current data points, and is sent to the current controller via a DAC card. The number and values of the data points can be adjusted to get the frequency, as measured on the etalon, as flat as possible. An iterative process can be used, as adjusting the feed-forward signal affects the heating of the laser diode and thus the correct feed-forward function as well.

Once the laser device has been partially stabilized with a feed-forward current, it is possible to lock the laser directly to atomic hyperfine transitions. The feed-forward current can consistently get the laser device to turn on and stabilize to within about 10 MHz of the required frequency in well under 1 ms, enabling the hyperfine spectroscopy lock to be engaged and lock the laser to a hyperfine transition in under 1 ms. The spectroscopy lock uses current feedback to stabilize the laser to sub-100-kHz absolute stability.

Figure 4:
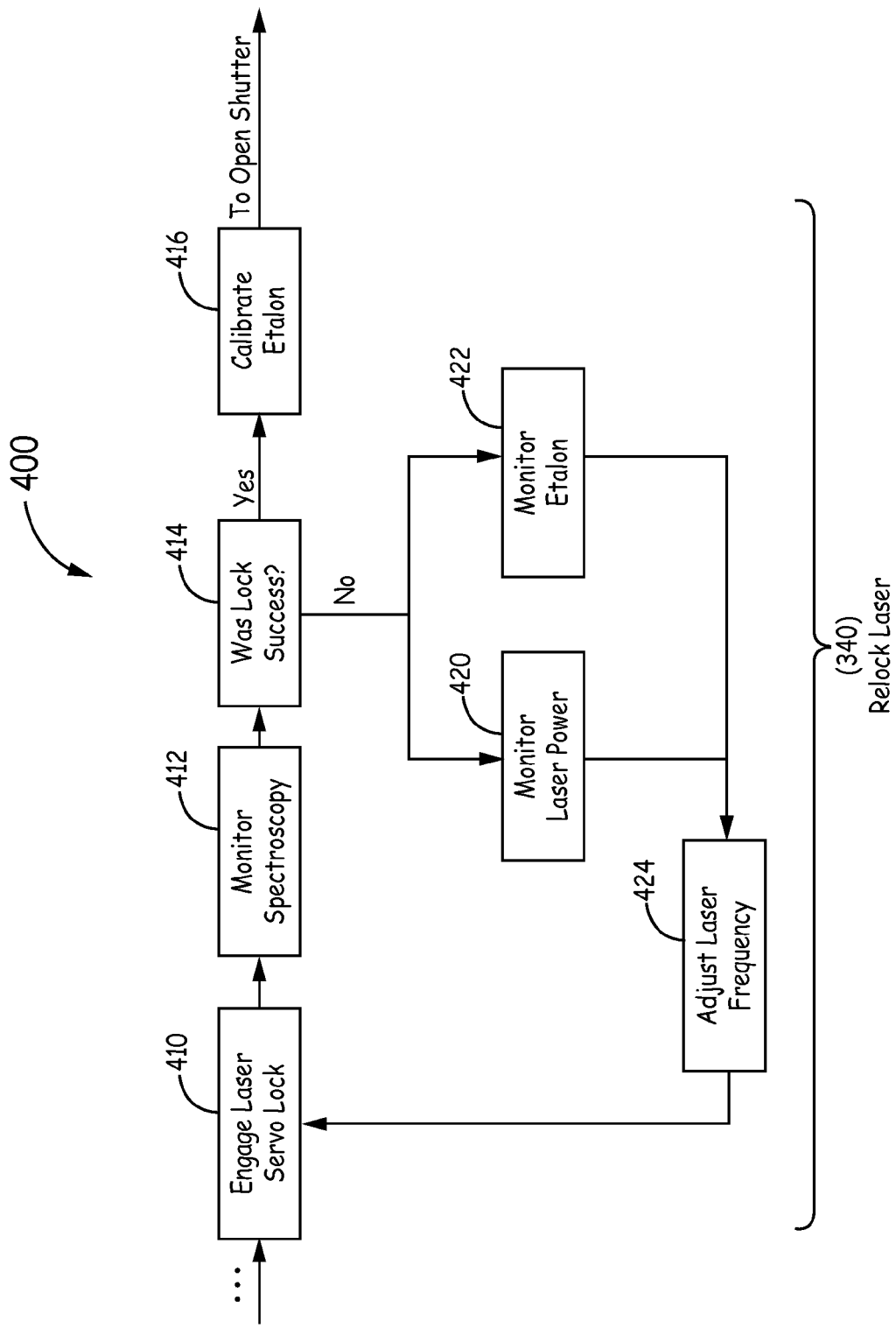
FIG. 4 is a flow diagram of an optional process for using an etalon to expand the capture range and relocking robustness of the laser apparatus of FIG. 1.

FIG. 4 is a flow diagram of an optional process 400 for using an etalon to expand the capture range and relocking robustness of the laser when the laser is relocked at 340 (from FIG. 3). During process 400, a laser servo lock is engaged at 410, and the spectroscopy is monitored at 412. A determination is made whether the lock was a success at 414. If yes, the etalon is calibrated at 416, and a shutter of the laser is opened. If the lock was not a success, the laser power is monitored at 420 and the etalon is monitored at 422. The laser frequency is then adjusted at 424, and the laser servo lock is engaged again at 410. The foregoing process is repeated as necessary until the lock is a success.

Figure 5:
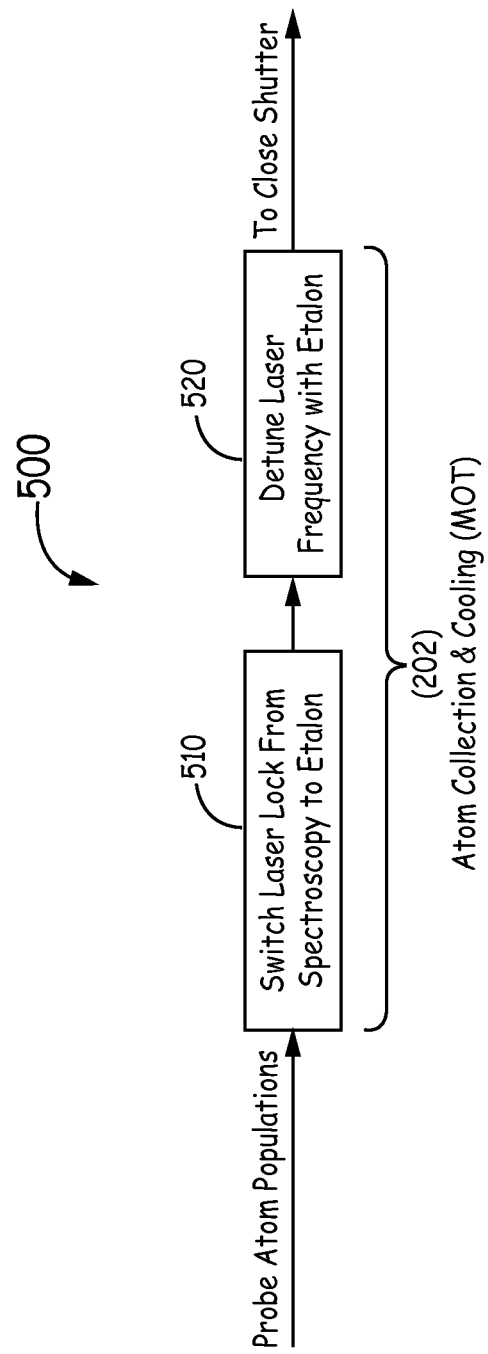
FIG. 5 is a flow diagram of an optional process for enabling laser detuning with an etalon lock during an atom collection and cooling stage used in the process of FIG. 2.

FIG. 5 is a flow diagram of an optional process 500 for enabling laser detuning with an etalon lock during the atom collection and cooling stage (MOT) at 202. Once the atom populations are probed (216 in FIG. 2), the laser lock is switched from spectroscopy to the etalon at 510. The laser frequency is then detuned with the etalon at 520, and a shutter (LAS) of the laser is closed.

Since the error signal derived from a vapor cell gives a very narrow capture range (about 20 MHz), a solid etalon with a 10 GHz FSR can be used as a second frequency discriminator in one embodiment. Part of the laser light is passed through the etalon to generate an error signal. This error signal enhances the capture range of the feedback circuit. For example, the laser diode can be locked to the zero-crossing point on the etalon error signal and the error signal from the spectroscopy measures the detuning from the atomic transition. The detuning error signal is used to temperature-tune the etalon back to zero detuning from the atomic transition. Thus, the absolute accuracy of the spectroscopy is transferred to the etalon. This approach utilizes the spectroscopy signal for absolute DC stability, while exploiting the large capture range of the etalon for feedback corrections to large frequency perturbations.

In one example, a lock to an atomic transition was completed within 1 ms after turning on the current of a DBR laser diode. The laser diode was turned off for 15 ms on a 10-30 Hz cycle time. It should be noted that the feed-forward signal caused the power of the laser diode to vary by approximately 20% in this example, so intensity normalization is required when using an etalon to measure the laser frequency. This example applied a maximum 20 mA of feed-forward current out of a quiescent current of 130 mA. This was sufficient to cancel thermal effects occurring about 500 µs after laser turn-on. A higher feed-forward current can be used to lock the laser in less than 500 µs from turn-on if desired.

Example Embodiments

Example 1 includes a method for reducing or eliminating clock bias in an atomic clock, the method comprising cooling a population of atoms collected in the atomic clock using a laser locked at a predetermined frequency; turning off the laser; performing atomic clock spectroscopy; turning on the laser after the atomic clock spectroscopy; relocking the frequency of the laser to an external reference cell; and probing the population of atoms that are in each of two ground hyperfine levels using laser light that is on or near-resonant with a selected atomic transition.

Example 2 includes the method of Example 1, wherein the population of atoms is collected in a magneto-optical trapping device in a physics package of the atomic clock.

Example 3 includes the method of any of Examples 1-2, wherein the atomic clock spectroscopy is performed using radio frequency spectroscopy to measure a hyperfine transition of the atoms.

Example 4 includes the method of any of Examples 1-3, wherein after turning on the laser, an etalon is used to measure the frequency of the laser.

Example 5 includes the method of any of Examples 1-4, wherein the frequency of the laser is relocked to the atomic clock spectroscopy to make the light resonant with an optical transition.

Example 6 includes the method of any of Examples 1-5, wherein during relocking the frequency of the laser, the method further comprises applying a feed-forward signal to the laser to compensate for a thermal change in the laser; waiting for the frequency of the laser to at least partially stabilize; and relocking the frequency of the laser directly to an atomic hyperfine transition.

Example 7 includes the method of Example 6, wherein the feed-forward signal is a controllable arbitrary time-varying signal.

Example 8 includes the method of any of Examples 6-7, wherein the feed-forward signal is generated by a computer using a spline function to join a set of time and current data points.

Example 9 includes the method of any of Examples 1-8, wherein during probing, the population of atoms is determined from fluorescence photons from each of the two ground hyperfine levels.

Example 10 includes the method of any of Examples 1-9, wherein during relocking the frequency of the laser, the method further comprises: (a) engaging a laser servo lock; (b) monitoring the atomic clock spectroscopy; and (c) determining whether the lock succeeded; wherein if the lock succeeded, the method comprises calibrating an etalon, and opening a shutter of the laser; and wherein if the lock did not succeed, the method comprises monitoring power of the laser, monitoring the etalon, adjusting the frequency of the laser, and repeating the method starting at (a).

Example 11 includes the method of any of Examples 1-10, wherein after probing the population of atoms, the method further comprises detuning the frequency of the laser with an etalon lock during cooling the population of atoms collected in the atomic clock when the method is repeated.

Example 12 includes an apparatus comprising a laser device that is configured to emit laser light at a predetermined frequency that is transmitted to a physics package of an atomic clock; a first photodetector in optical communication with the laser device; an external reference cell in optical communication with the laser device; a second photodetector in optical communication with the external reference cell; and a processing unit in signal communication with the first and second photodetectors, the processing unit configured to perform a method for reducing or eliminating clock bias in the atomic clock. The method comprises cooling a population of atoms collected in the atomic clock using laser light from the laser device that is locked at a predetermined frequency; turning off the laser device; performing radio frequency (RF) spectroscopy in the atomic clock; turning on the laser device after performing the RF spectroscopy; relocking the frequency of the laser device to the external reference cell; and probing the population of atoms that are in each of two ground hyperfine levels in the atomic clock using laser light that is on or near-resonant with a selected atomic transition.

Example 13 includes the apparatus of Example 12, wherein the laser device comprises a distributed Bragg reflector laser diode, or a vertical-cavity surface-emitting laser.

Example 14 includes the apparatus of any of Examples 12-13, wherein the external reference cell is configured for saturated absorption spectroscopy.

Example 15 includes the apparatus of any of Examples 12-14, further comprising a controller or servo unit operatively coupled to the processing unit and configured to transmit a feedback signal to an input of the laser device to adjust the frequency of the laser light.

Example 16 includes the apparatus of any of Examples 12-15, further comprising an RF generating device that transmits an RF signal to the laser device.

Example 17 includes the apparatus of any of Examples 12-16, further comprising an etalon in optical communication with the laser device.

Example 18 includes the apparatus of Example 17, further comprising a third photodetector in optical communication with the etalon and configured to transmit an electrical signal to the processing unit.

Example 19 includes the apparatus of any of Examples 12-18, wherein the processing unit is configured to execute processor readable instructions to perform the method for reducing or eliminating clock bias in the atomic clock.

Example 20 includes the apparatus of any of Examples 12-19, wherein the processing unit includes one or more processors incorporated in an application-specific integrated circuit, or a field-programmable gate array.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method for reducing or eliminating clock bias in an atomic clock, the method comprising:
    cooling a population of atoms collected in the atomic clock using a laser device locked at a predetermined frequency;
    turning off the laser device by removing a current in the laser device;
    performing atomic clock spectroscopy;
    turning on the laser device after the atomic clock spectroscopy;
    relocking the frequency of the laser device to an external reference cell; and
    probing the population of atoms that are in each of two ground hyperfine levels using laser light that is on or near-resonant with a selected atomic transition.

2. The method of claim 1, wherein the population of atoms is collected in a magneto-optical trapping device in a physics package of the atomic clock.

3. The method of claim 1, wherein the atomic clock spectroscopy is performed using radio frequency spectroscopy to measure a hyperfine transition of the atoms.

4. The method of claim 1, wherein after turning on the laser device, an etalon is used to measure the frequency of the laser device.

5. The method of claim 1, wherein the frequency of the laser device is relocked to the atomic clock spectroscopy to make the laser light resonant with an optical transition.

6. The method of claim 1, wherein during relocking the frequency of the laser device, the method further comprises:
applying a feed-forward signal to the laser device to compensate for a thermal change in the laser device;
waiting for the frequency of the laser device to at least partially stabilize; and
relocking the frequency of the laser device directly to an atomic hyperfine transition.

7. The method of claim 6, wherein the feed-forward signal is a controllable arbitrary time-varying signal.

8. The method of claim 6, wherein the feed-forward signal is generated by a computer using a spline function to join a set of time and current data points.

9. The method of claim 1, wherein during probing, the population of atoms is determined from fluorescence photons from each of the two ground hyperfine levels.

10. The method of claim 1, wherein during relocking the frequency of the laser device, the method further comprises:
(a) engaging a laser servo lock;
(b) monitoring the atomic clock spectroscopy; and
(c) determining whether the lock succeeded;
wherein if the lock succeeded, the method comprises:
calibrating an etalon; and
opening a shutter of the laser device;
wherein if the lock did not succeed, the method comprises:
monitoring power of the laser device;
monitoring the etalon;
adjusting the frequency of the laser device; and
repeating the method starting at (a).

11. The method of claim 1, wherein after probing the population of atoms, the method further comprises detuning the frequency of the laser device with an etalon lock during cooling the population of atoms collected in the atomic clock when the method is repeated.

12. An apparatus, comprising:
a laser device that is configured to emit laser light at a predetermined frequency that is transmitted to a physics package of an atomic clock;
a first photodetector in optical communication with the laser device;
an external reference cell in optical communication with the laser device;
a second photodetector in optical communication with the external reference cell;
a processing unit in signal communication with the first and second photodetectors, the processing unit configured to perform a method for reducing or eliminating clock bias in the atomic clock, the method comprising:
cooling a population of atoms collected in the atomic clock using laser light from the laser device that is locked at a predetermined frequency;
turning off the laser device;
performing radio frequency (RF) spectroscopy in the atomic clock;
turning on the laser device after performing the RF spectroscopy;
relocking the frequency of the laser device to the external reference cell; and
probing the population of atoms that are in each of two ground hyperfine levels in the atomic clock using laser light that is on or near-resonant with a selected atomic transition.

13. The apparatus of claim 12, wherein the laser device comprises a distributed Bragg reflector laser diode, or a vertical-cavity surface-emitting laser.

14. The apparatus of claim 12, wherein the external reference cell is configured for saturated absorption spectroscopy.

15. The apparatus of claim 12, further comprising a controller or servo unit operatively coupled to the processing unit and configured to transmit a feedback signal to an input of the laser device to adjust the frequency of the laser light.

16. The apparatus of claim 12, further comprising an RF generating device that transmits an RF signal to the laser device.

17. The apparatus of claim 12, further comprising an etalon in optical communication with the laser device.

18. The apparatus of claim 17, further comprising a third photodetector in optical communication with the etalon and configured to transmit an electrical signal to the processing unit.

19. The apparatus of claim 12, wherein the processing unit is configured to execute processor readable instructions to perform the method for reducing or eliminating clock bias in the atomic clock.

20. The apparatus of claim 12, wherein the processing unit includes one or more processors incorporated in an application-specific integrated circuit, or a field-programmable gate array.

* * * * *